(12) United States Patent
Htet et al.

(10) Patent No.: US 12,217,799 B2
(45) Date of Patent: Feb. 4, 2025

(54) PARALLELIZED DEFECT DETECTION ACROSS MULTIPLE SUB-BLOCKS IN A MEMORY DEVICE

(71) Applicant: Micron Technology, Inc., Boise, ID (US)

(72) Inventors: Paing Z. Htet, Union City, CA (US); Akira Goda, Tokyo (JP); Eric N. Lee, San Jose, CA (US); Jeffrey S. McNeil, Nampa, ID (US); Junwyn A. Lacsao, Folsom, CA (US); Kishore Kumar Muchherla, San Jose, CA (US); Sead Zildzic, Folsom, CA (US); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 18/119,997

(22) Filed: Mar. 10, 2023

(65) Prior Publication Data
US 2023/0307053 A1    Sep. 28, 2023

Related U.S. Application Data

(60) Provisional application No. 63/322,293, filed on Mar. 22, 2022.

(51) Int. Cl.
*G11C 16/08* (2006.01)
*G11C 16/04* (2006.01)
*G11C 16/10* (2006.01)
*G11C 16/26* (2006.01)

(52) U.S. Cl.
CPC .......... *G11C 16/08* (2013.01); *G11C 16/0433* (2013.01); *G11C 16/102* (2013.01); *G11C 16/26* (2013.01)

(58) Field of Classification Search
CPC .... G11C 16/08; G11C 16/0433; G11C 16/102
See application file for complete search history.

(56) References Cited

U.S. PATENT DOCUMENTS

| | | | |
|---|---|---|---|
| 2006/0158932 A1* | 7/2006 | Tamada | G11C 16/26 365/185.2 |
| 2008/0089156 A1* | 4/2008 | Tohata | G11C 7/14 365/210.1 |

* cited by examiner

*Primary Examiner* — Han Yang
(74) *Attorney, Agent, or Firm* — Lowenstein Sandler LLP

(57) ABSTRACT

A memory array includes a block including wordlines, bitlines, and strings each connected to a respective bitline. The block is divided into a sub-blocks. Each sub-block includes a respective set of the strings, and each string of the set of strings is located at a sub-block position within its respective sub-block. Control logic performs operations including selecting each sub-block, causing a first voltage to be applied to a dummy wordline to activate a first set of dummy cells and deactivate a second set of dummy cells, and causing a second voltage to be applied to a selected wordline. Each sub-block includes a single string corresponding to an open string connected to a dummy cell of the first set of dummy cells. The second voltage causes data to be read out from each open string to a respective page buffer.

20 Claims, 9 Drawing Sheets

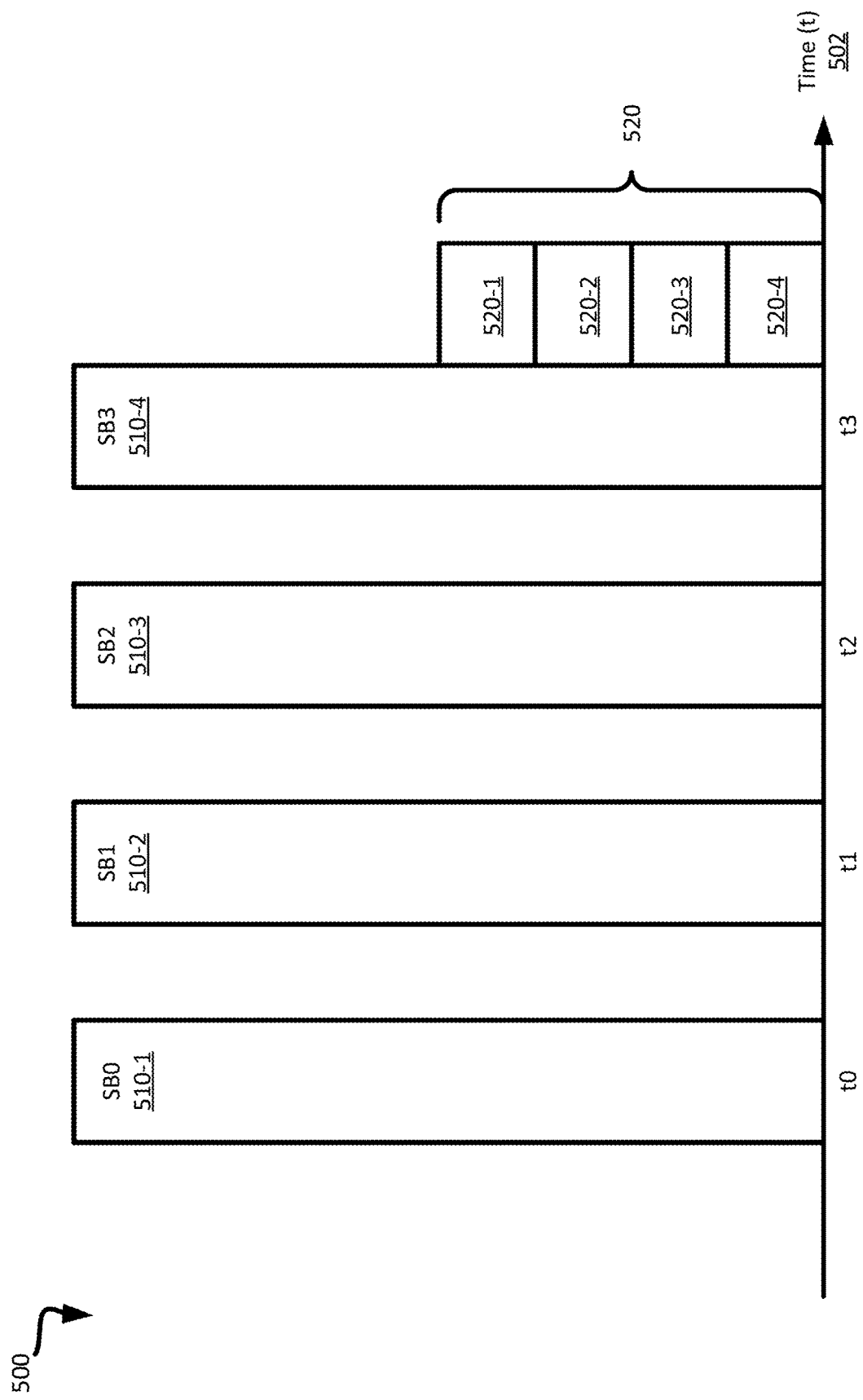

PARALLELIZED DEFECT DETECTION ACROSS MULTIPLE SUB-BLOCKS IN A MEMORY DEVICE

RELATED APPLICATION

This application claims the benefit of U.S. Provisional Application 63/322,293, filed on Mar. 22, 2022, the entire contents of which are incorporated by reference herein.

TECHNICAL FIELD

Embodiments of the disclosure relate generally to memory sub-systems, and more specifically, relate to parallelized defect detection across multiple sub-blocks in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a timing diagram illustrating an implementation of defect detection, in accordance with some embodiments.

DETAILED DESCRIPTION

Figure 1A:
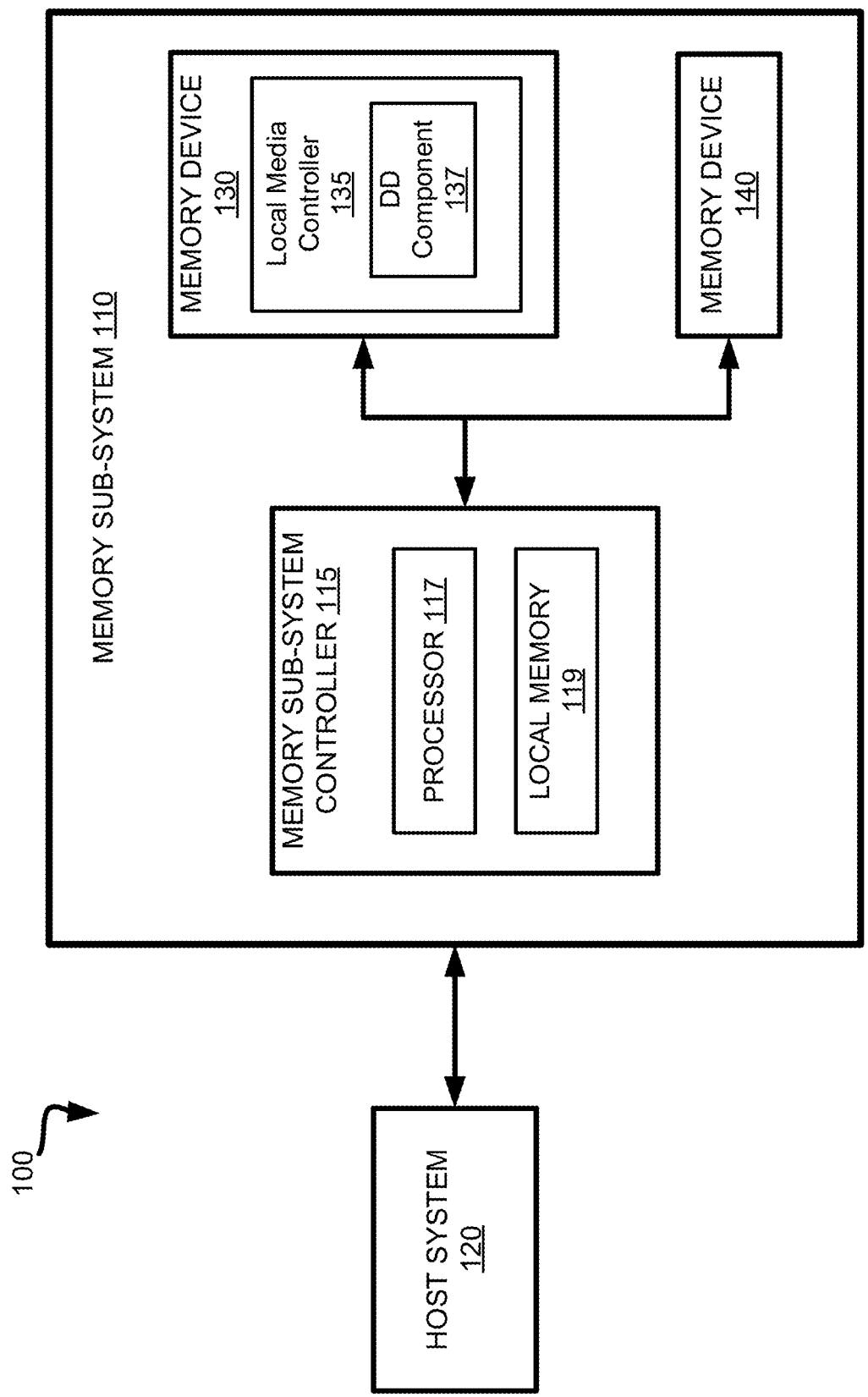
FIG. 1A illustrates an example computing system that includes a memory sub-system in accordance with some embodiments of the present disclosure.

Aspects of the present disclosure are directed to parallelized defect detection across multiple sub-blocks in a memory device of a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T,V_T+dV_T]$ when charge Q is placed on the cell.

A memory device can have distributions $P(Q,V_T)$ that are narrow compared with the working range of control voltages tolerated by the cells of the device. Accordingly, multiple non-overlapping distributions $P(Q_k,V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2n levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of memory cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) is a metric that refers to the cumulative value of the read windows. RWB can be used to assess the health or endurance of a memory device. For example, in TLC cells, the RWB can be the cumulative value (e.g., voltage) of the seven read windows between the eight $V_T$ distributions. The RWB can be affected by various factors that shift $V_T$ distributions, such as temperature, wear cycling (e.g., program/erase cycles), etc. Therefore, RWB can vary over time, which can affect system quality of service (QoS), reliability, and/or performance.

A block of a memory device can include a number of sub-blocks. Each sub-block can be defined by a respective group of strings of cells ("strings"), where each string is connected to a respective bitline. Each string can be located in a respective position within its sub-block, and strings located in the same position can be connected to the same page buffer. Each page buffer can be used to read a string connected to its page buffer. Accordingly, a page buffer can be shared by multiple strings across multiple sub-blocks.

For example, if a block includes 4 sub-blocks, then there can be 4 page buffers, where a first page buffer is connected to each string that is located in a first position of its sub-block, a second page buffer is connected to each string that is located in a second position of its sub-block, a third page buffer is connected to each string that is located in a third position of its sub-block, and a fourth page buffer is connected to each string that is located in a fourth position of its sub-block. In some embodiments, a sub-block can be a 16 kilobyte (KB) sub-block. Each string in a sub-block can correspond to a respective byte range defined by its position. For example, if each sub-block is a 16 KB sub-block, a sub-block can include a string in a position corresponding to a 0-4 kilobyte (KB) range, a string in a position corresponding to a 4-8 KB range, a string in a position corresponding to an 8-12 KB range, and a string in a position corresponding to a 12-16 KB range.

As described above, the reliability of data stored at a memory cell can decrease over time. For example, $V_T$ of a cell or a $V_T$ distribution of multiple cells can shift over time. Some cells can be corrupt or unreadable due to the $V_T$ shift, temperature, program/erase cycles or other stresses on the memory cell. Therefore, the memory device can periodically perform defect detection operations on a memory device to check for defects (e.g., electrical defects). Typically, the defect detection operations are verify operations.

For example, the memory device can perform a defect detection operation by reading data from a sub-block to determine if cells have shifted logic states or are unreadable, determine error rates, or determine how many bits are allowed to fail before a codeword stored across memory cells is unreadable or corrupted. The defect detection operation can be an internal operation performed by control logic of the memory device. That is, the memory device can perform periodic defect detection operations without commands from a host device. In certain instances, the memory device can perform defect detection operations as it receives commands from the host device (e.g., the memory device can receive a read command while performing a defect detection operation). In such instances, the memory device can complete a defect detection operation before executing the read command. Accordingly, the memory device read latency (e.g., the time it takes the memory device to perform the read operation) can increase and the overall performance of the system can decrease (e.g., since the host device must wait longer to receive the data requested form the memory device).

As described above, each page buffer can be connected to multiple strings (i.e., the strings in the same position within each sub-block). Due to this, it can be impossible to perform a defect detection operation in parallel across multiple sub-blocks, as the data obtained from the multiple sub-block strings connected to the same page buffer will overlap (resulting in page buffer collision). Therefore, only one sub-block is selected (e.g., enabled) for defect detection at a time during a verify operation.

Moreover, some memory device implementations may not be configured to support a defect detection operation (e.g., verify operation). For example, such memory device implementations may be unable to manage the increased overhead and reduced Quality of Service (QoS) attributable to defect detection. In such implementations, as undetected defects accumulate over time, the probability of data loss can increase (e.g., due to stripe failures or lack of valid data copies). Thus, providing a solution that can enable parallel defect detection and/or enable defect detection for verify-less memory device implementations can improve memory device performance and reliability.

Aspects of the present disclosure address the above and other deficiencies by implementing parallelized defect detection across multiple sub-blocks in a memory device of a memory sub-system. The parallelized defect detection described herein can be viewed as "a pseudo page verify" scan. The parallelized defect detection methods described herein are low latency methods of defect detection, which can be used in verify-less memory device implementations. Thus, the parallelized defect detection methods described herein can provide effective low cost solutions that integrate verify-less programming implementations and defect scans with minimal command overhead.

Parallelized defect detection can be implemented with respect to multiple sub-blocks of a block of a memory device. In some embodiments, the block includes four sub-blocks. The block can include a number of wordlines each connected to a respective set of cells. For example, the wordlines can include a combination of data wordlines and dummy wordlines. A dummy wordline can refer to a wordline that is connected to dummy cells that do not store user data (e.g., do not store data for a host device operatively coupled to the memory sub-system). In some embodiments, the cells include SLC cells. However the cells can have any suitable cell type in accordance with embodiments described herein.

Each sub-block can include a number of strings of cells each connected to a respective bitline, where each string represents a portion of the byte size ("size") of the sub-block. For example, if a sub-block has a size of 16 KB and 4 strings, then each string can have a size of 4 KB. Each string can be located at a respective position (e.g., logical position) within its respective sub-block. For example, if a sub-block includes four strings, then a first string can be located in a first position within the sub-block (e.g., 0-4 KB string), a second string can be located in a second position within the sub-block (e.g., 4-8 KB string), a third string can be located in a third position within the sub-block (e.g., 8-12 KB string), and a fourth string can be located in a fourth position within the sub-block (e.g., 12-16 KB string). Each string can be connected to a page buffer (e.g., page buffer), where strings in the same position in each sub-block are connected to the same page buffer. For example, a string in a first position within a first sub-block can be connected to the same page buffer as a string in the first position within a second sub-block.

To implement the parallelized defect detection across the multiple sub-blocks, a controller can implement a dummy wordline masking scheme with respect to a dummy wordline. The dummy wordline can also be referred to as a mask wordline. To implement the dummy wordline masking scheme, the controller can program a dummy cell pattern with respect to the dummy cells connected to the mask wordline. More specifically, the dummy cell pattern can include a number of low $V_T$ dummy cells each having a low $V_T$ state (e.g., erased state) and a number of high $V_T$ dummy cells each having a high $V_T$ state (e.g., programmed state), where each sub-block includes a single low $V_T$ dummy cell. The position of the single low $V_T$ dummy cell in each sub-block can be staggered. For example, if the block includes 4 sub-blocks, the low $V_T$ dummy cell of a first sub-block can be connected to the string in the first position, the low $V_T$ dummy cell of a second sub-block can be connected to the string in the second position, the low $V_T$ dummy cell of a third sub-block can be connected to the string in the third position, and the low $V_T$ dummy cell of a fourth sub-block can be connected to the string in the fourth position. As will be described in further detail below, the dummy cell pattern can enable concurrent or parallel data sampling across the sub-blocks in a manner that prevents page buffer collision.

The controller can initiate a ganged read to select (e.g., enable) each of the sub-blocks. The controller can select the sub-blocks by causing respective voltages to be applied to respective select gate lines. For example, the controller can simultaneously select the sub-blocks. The purpose of selecting each sub-block is to parallelize the defect detection across the sub-blocks, instead of performing the defect defection serially on an individual sub-block basis.

Once the sub-blocks are selected, the controller can apply a mask wordline voltage to the dummy cells connected to the mask wordline. The mask wordline voltage is selected as a voltage that places the low $V_T$ dummy cells of the mask wordline in an on state (e.g., activates the low $V_T$ dummy cells) and places the high $V_T$ dummy cells of the mask wordline in an off state (e.g., deactivates the high $V_T$ dummy cells). For example, the mask wordline voltage can be a voltage located in a valley or read window between the erased state distribution and the programmed state distribution.

The controller can apply a voltage to data cells of a selected data wordline to read out data from each sub-block. Since the high $V_T$ dummy cells within each sub-block prevent data from traveling through their respective "closed" strings to respective page buffers, the data that is read out from each sub-block is data from the single "selected" string of each sub-block connected to the low $V_T$ dummy cell. Moreover, since strings having the same sub-block position are connected to the same page buffer, and each selected string is in a different sub-block position, data from each selected string (and thus each sub-block) is read out to a different respective page buffer. Accordingly, the dummy cell pattern can enable parallelized defect detection (e.g., verify) across multiple sub-blocks in a single defect detection operation (e.g., simultaneously), as opposed to performing serial defect detection on each of the sub-blocks using individual defect detection operations.

To perform defect detection, the data read out from each sub-block can be compared to verified data. Typically, each sub-block is programmed at a different time interval. For example, assume that there are four sub-blocks SB0-SB3, where SB0 is programmed at time t0, SB1 is programmed at time t1, SB2 is programmed at time t2 and SB3 is programmed at time t3. By the time SB3 is programmed, the data pattern on SB0-SB3 could be lost. To overcome this challenge of losing data over time, a number of different methods can be used. One method is using valley check as a proxy for data integrity, since the presence of bits within the valley can be indicative of a defect. Another method is programming the sub-blocks back-to-back without verify. As the program pattern of each sub-block is available in the page buffer, the data from each sub-block (e.g., 4 KB data) is gathered to match the mask imprint. Then, verified data can be compared against the gathered data from each of the sub-blocks.

The controller can report the result of the defect check. For example, in redundant array of independent memory (RAIM) solutions, such as redundant array of independent NAND (RAIN) solutions, the controller can report the result of the defect check to firmware of the memory sub-system. The firmware can execute data recovery using a RAIM method. A RAIM method utilizes additional memory modules and striping methods to protect against the failure of any particular module and keep the memory sub-system operating continuously. In RAIM-less solutions, the defect check can be reported to the host. The host can rewrite the data to a new location.

Since only one string from each sub-block is selected to read out data to a respective page buffer, only a portion of the data of each sub-block is used to perform defect detection for the sub-block. For example, if there are four strings within each sub-block, about one quarter the cells of the sub-block can be analyzed for defect detection (e.g., 4 KB of data can be read or verified per 16 KB sub-block). Defects (e.g., electrical defects tend to occur over a physical area, and thus sampling with logical-to-physical (L2P) mapping can provide sufficient defect coverage. For example, L2P mapping between a logical byte address and a physical byte address generally has sufficiently high randomization, such that defect detection performed based on a portion of the (logical) data of a sub-block (e.g., a quarter) can cover the defect detection of the (physical) data for the entire sub-block. For example, if the sub-block having a total physical size of 16 KB includes four strings each having a logical size of 4 KB, it can be sufficient to sample the data from the single selected 4 KB string of the sub-block to perform defect detection on behalf of the entire sub-block.

Advantages of the present disclosure include, but are not limited to, improved memory device reliability and performance. For example, embodiments described herein can remove the need to perform traditional defect detection (e.g., verify) operations, which consume more time and resources. Moreover, performing parallel defect detection across each sub-block in a single defect detection operation can reduce time and resources as compared to performing serial defect detection on each sub-block using individual defect detection operations. For example, the mask wordline programming can occur once in the block (e.g., single dummy wordline), followed by data wordline programming and defect detection for the entire block (e.g., multiple data wordlines). The mask wordline programming overhead can be small compared to the data wordline programming and benefits from the defect detection process described herein. The mask wordline programming overhead can decrease as the number of wordlines increases (e.g., vertical scaling of a 3D memory device).

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a defect detection (DD) component 137 that can implement parallelized defect detection across multiple sub-blocks of a block (i.e. memory array) of a memory device (e.g., memory device 130). The block can include a number of wordlines each connected to a respective set of cells. For example, the wordlines can include a combination of data wordlines and dummy wordlines. A dummy wordline can refer to a wordline that is connected to dummy cells that do not store user data (e.g., do not store data for a host device operatively coupled to the memory sub-system). In some embodiments, the cells include SLC cells. However the cells can have any suitable cell type in accordance with embodiments described herein. The block can include a number of sub-blocks. For example, the block can include four sub-blocks. Each sub-block can include a number of strings of cells ("strings") each connected to a respective bitline, where each string represents a portion of the byte size ("size") of the sub-block. For example, if a sub-block has a size of 16 KB and 4 strings, then each string can have a size of 4 KB. Each string can be located at a sub-block position ("position") within its respective sub-block. For example, if a sub-block includes 4 strings, then a first string can be located in a first position within the sub-block (e.g., 0-4 KB string), a second string can be located in a second position within the sub-block (e.g., 4-8 KB string), a third string can be located in a third position within the sub-block (e.g., 8-12 KB string), and a fourth string can be located in a fourth position within the sub-block (e.g., 12-16 KB string). Each string can be connected to a page buffer (e.g., page buffer), where strings in the same position in each sub-block are connected to the same page buffer. For example, a string in a first position within a first sub-block can be connected to the same page buffer as a string in the first position within a second sub-block.

The DD component 137 can implement a dummy wordline masking scheme with respect to dummy cells connected to a dummy wordline, referred to as a mask wordline. To implement the dummy wordline masking scheme, the DD component 137 can program a dummy cell pattern with respect to the dummy cells. More specifically, the dummy cell pattern can include a number of low $V_T$ dummy cells each having a low $V_T$ state (e.g., erased state) and a number of high $V_T$ dummy cells each having a high $V_T$ state (e.g., programmed state), where each sub-block includes a single low $V_T$ dummy cell connected to a single string, referred to as an open string. The position of each open string is different or unique among the sub-blocks. For example, if the block includes 4 sub-blocks, the open string of a first sub-block can be in the first position, the open string of a second sub-block can be in the second position, the open string of a third sub-block can be in the third position, and the open string of a fourth sub-block can be in the fourth position. Accordingly, since strings having the same position are connected to the same page buffer, and none of the open strings have a same position, each of the open strings is connected to a different page buffer.

To perform parallelized defect detection across the sub-blocks, the DD component 137 can initiate a ganged read to select (e.g., enable) each of the sub-blocks. The DD component 137 can select the sub-blocks by causing respective voltages to be applied to respective select gate lines. For example, the controller can simultaneously select the sub-blocks. The purpose of selecting each sub-block is to parallelize the defect detection across the sub-blocks, instead of performing the defect detection on an individual sub-block basis.

Once the sub-blocks are selected, the DD component 137 can cause a mask wordline voltage to be applied to a dummy wordline of the plurality of wordlines. The mask wordline voltage is selected as a voltage that places the low $V_T$ dummy cells of the mask wordline in an on state (i.e., activates the low $V_T$ dummy cells) and places the high $V_T$ dummy cells of the mask wordline in an off state (i.e., deactivates the high $V_T$ dummy cells). For example, the mask wordline voltage can be a voltage located in a valley or read window between the erased state distribution and the programmed state distribution.

The DD component 137 can cause an unselected wordline voltage to be applied to data cells connected to at least one unselected wordline, and then cause a selected wordline voltage to be applied to data cells connected to a selected wordline. The unselected wordline voltage activates the data cells to enable data to be read out from each sub-block to a respective page buffer, and the second voltage causes the data to be read out from each sub-block to the respective page buffer. Since the high $V_T$ dummy cells within each sub-block prevent data from traveling through the closed string to their respective page buffers, the data that is read out from each sub-block is data from the open string of the sub-block. For example, if there are 4 sub-blocks, a first page buffer can receive data from the first string of memory cells in the first sub-block, a second page buffer can receive data from the second string of memory cells in the second sub-block, a third page buffer can receive data from the third string of memory cells in the third sub-block, and a fourth page buffer can receive data from the fourth string of memory cells in the fourth sub-block. Defect detection can be performed in parallel across the sub-blocks based on the data read out to the page buffers. Accordingly, the staggering of the low $V_T$ dummy cells among the sub-blocks creates an emulated multiplexing of non-overlapping byte ranges, which can enable parallelized defect detection to performed across the sub-blocks in a single defect detection operation (e.g., simultaneously), as opposed to performing serial defect detection on each of the sub-blocks using individual defect detection operations.

Typically, each sub-block is programmed at a different time interval. For example, assume that there are four sub-blocks SB0-SB3, where SB0 is programmed at time t0, SB1 is programmed at time t1, SB2 is programmed at time t2 and SB3 is programmed at time t3. However, by the time SB3 is programmed, the data pattern can be lost. To overcome this challenge, a number of different methods can be used by the local media controller 135. One method is using valley check as a proxy for data integrity, since the presence of bits within the valley can be indicative of a defect. Another method is programming in sub-blocks. For example, the local media controller 135 can program SB0-SB3 back-to-back without verify. As the program pattern of each sub-block is available in the page buffer, the data from each sub-block (e.g., 4 KB data) is gathered to match the mask imprint. For example, the data from each sub-block can be scatter gathered. Then, verified data can be compared against the gathered data from each of the sub-blocks. The local media controller 135 can report the result of the defect check performed by the DD component 137. For example, in redundant array of independent memory (RAIM) solutions, such as redundant array of independent NAND (RAIN) solutions, the local media controller 135 can report the result of the defect check to firmware of the memory sub-system 110. The firmware can execute data recovery using a RAIM method. A RAIM method utilizes additional memory modules and striping methods to protect against the failure of any particular module and keep the memory sub-system operating continuously. In RAIM-less solutions, the defect check can be reported to the memory sub-system controller 115 to rewrite the data to a new location. Further details regarding the operations of the local media controller 135 and the DD component 137 will be described below with reference to FIGS. 4-5.

Figure 1B:
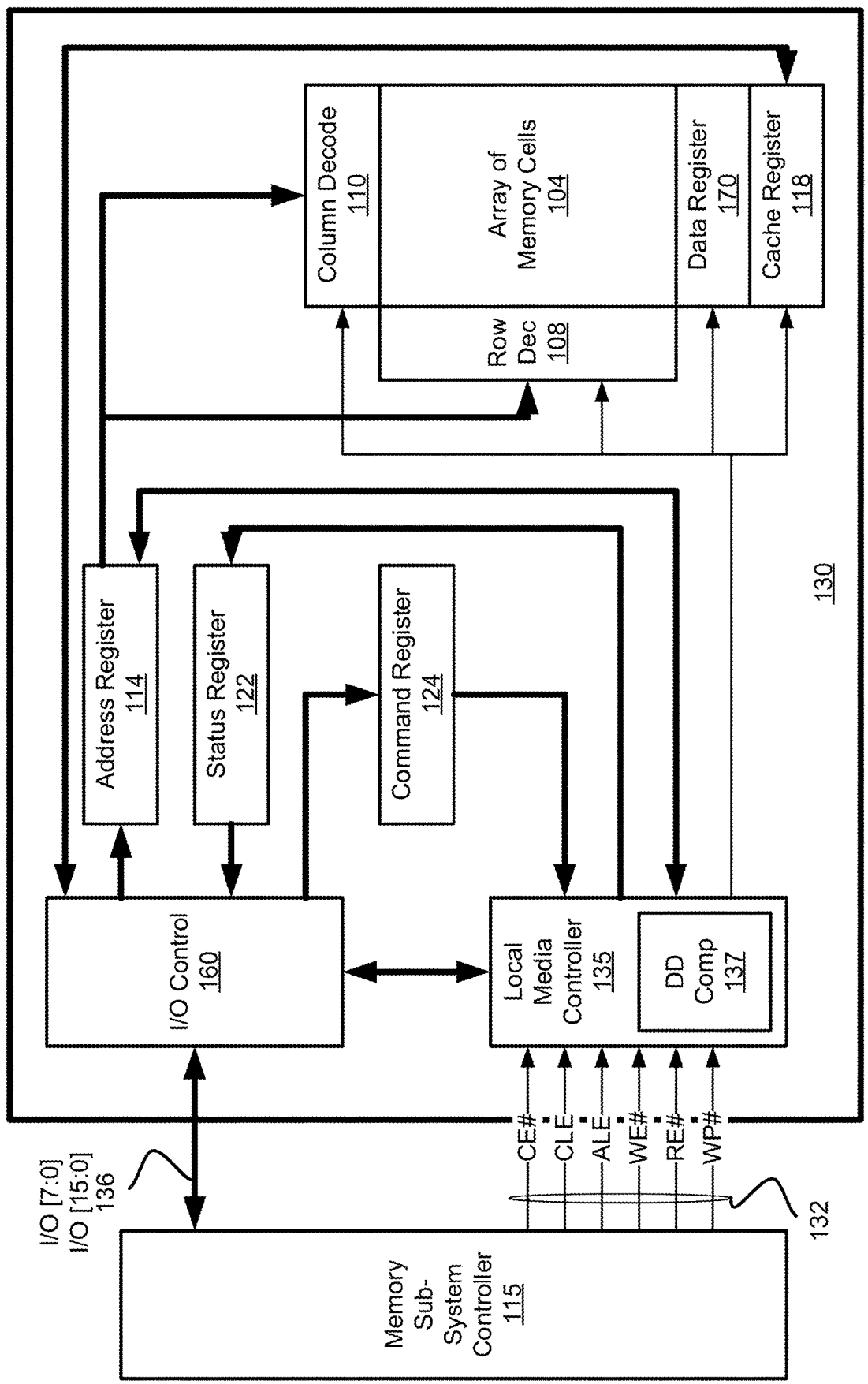
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, local media controller 135 includes the DD component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2:
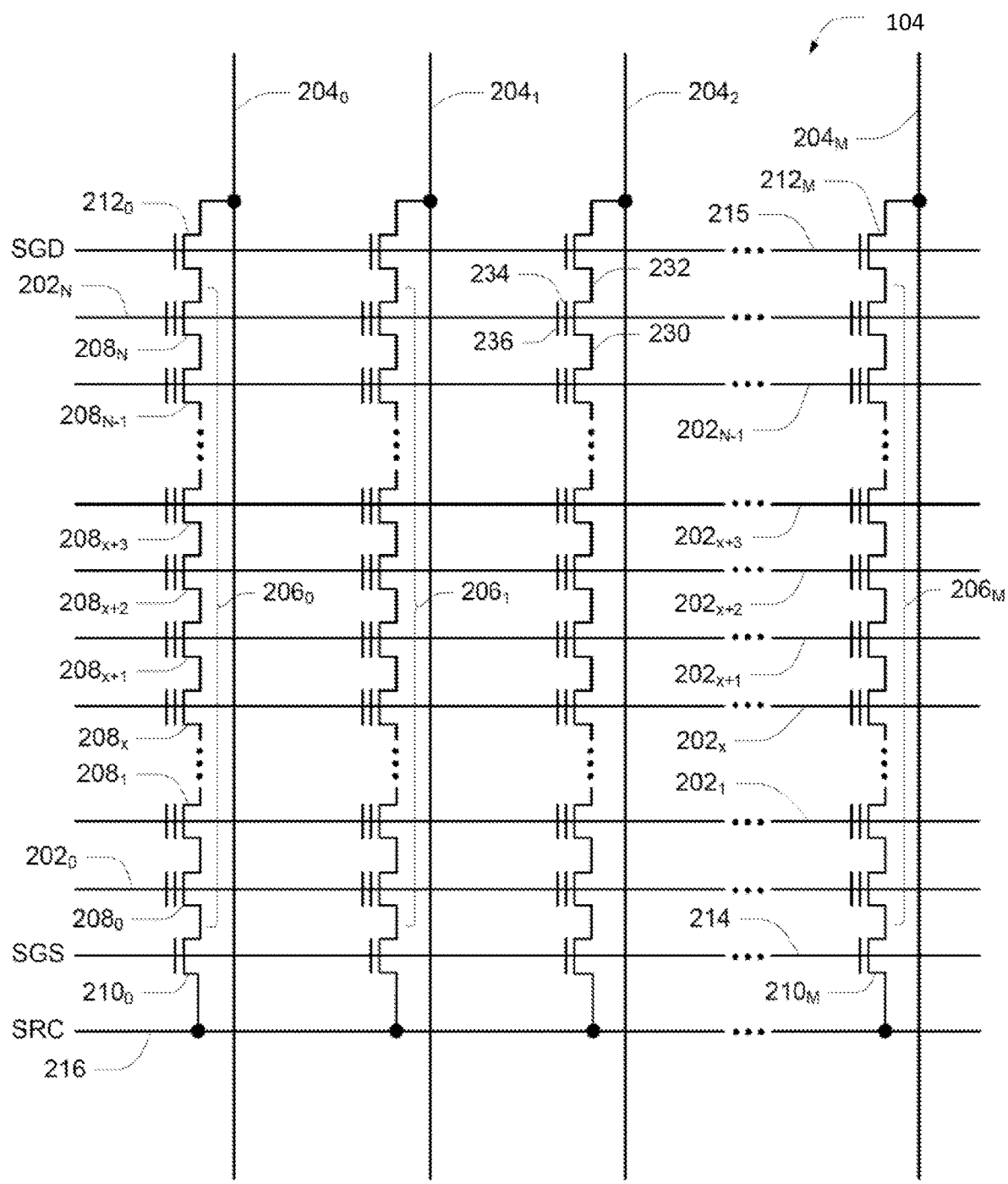
FIG. 2 is a schematic of portions of an array of memory cells as could be used in a memory of the type described with reference to FIG. 1B, in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
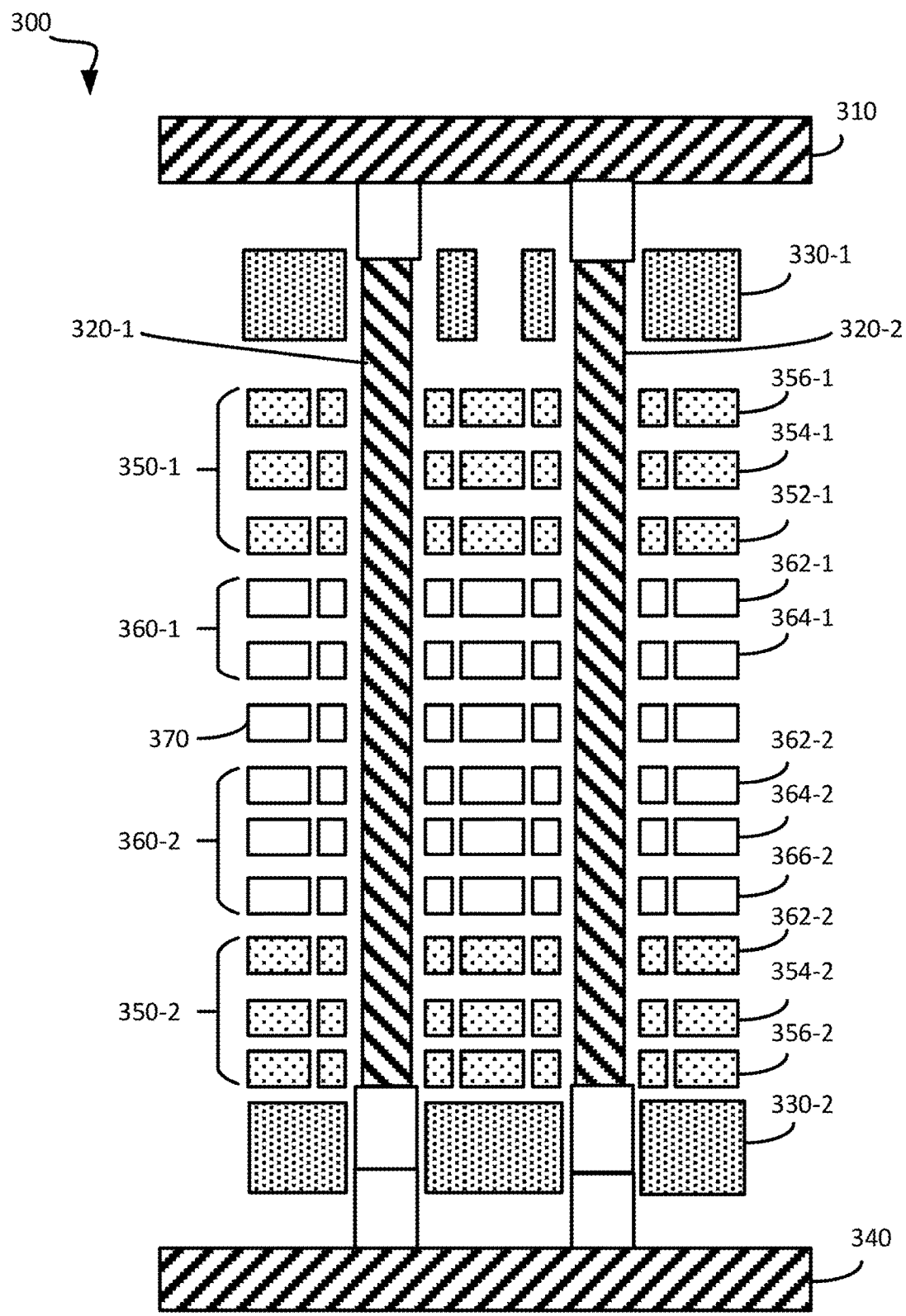
FIG. 3 is a diagram of an example three-dimensional (3D) replacement gate memory device that can implement concurrent programming of retired wordline cells with dummy data, in accordance with some embodiments of the present disclosure.

FIG. 3 is a diagram of an example three-dimensional (3D) replacement gate memory device ("device") 300 that can implement concurrent programming of retired wordline cells with dummy data, in accordance with some embodiments of the present disclosure. However, the embodiments described herein can be applied to any suitable memory device.

As shown, the device 300 includes a bitline contact 310, pillars 320-1 and 320-2, select gates (SGs) 330-1 and 330-2, a source line contact 340, and WL groups 350-1, 350-2, 360-1 and 360-2. More specifically, WL groups 350-1 and 350-2 are dummy WL groups, and WL groups 360-1 and 360-2 are data WL groups. WL group 350-1 includes dummy WLs 352-1 through 366-1, WL group 650-2 includes dummy WLs 352-2 through 356-2, WL group 360-1 includes active WLs 362-1 and 364-1, and WL group 360-2 includes data WLs 362-2, 364-2 and 366-2. However, such an example should not be considered limiting. A dummy WL corresponds to memory cells that do not store dummy data (not host data) and are included to satisfy processing margins, while an active or data WL corresponds to memory cells that store host data. For example, a dummy WL can be a retired WL.

As further shown, a WL 370 is provided. In some embodiments, the device 300 is a multiple deck device, in which WL groups 350-1 and 360-1 are associated with a first deck (e.g., an upper deck) of the device 300 and the WL groups 350-2 and 360-2 are associated with a second deck (e.g., a lower deck) of the device 300, such that the WL 370 corresponds to a dummy WL separating the WL groups 360-1 and 360-2. In other embodiments, the device 300 is a "single deck" device, in which the WL groups 360-1 and 360-2 are not arranged in decks. Here, the WL 370 can be an active WL within one of the WL groups 360-1 or 360-2.

Figure 4A:
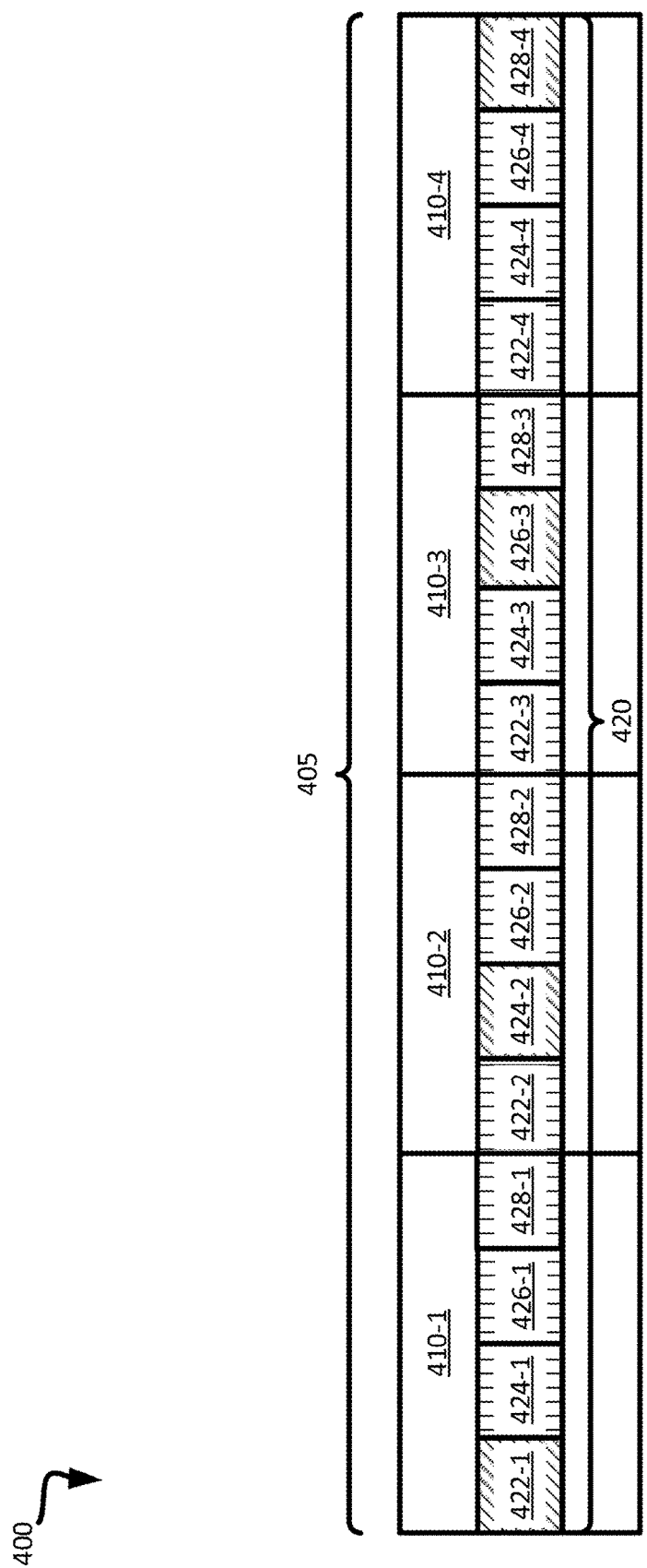
FIGS. 4A-4B are diagrams illustrating an example implementation of parallelized defect detection across multiple sub-blocks in a memory device, in accordance with some embodiments.
Figure 4B:
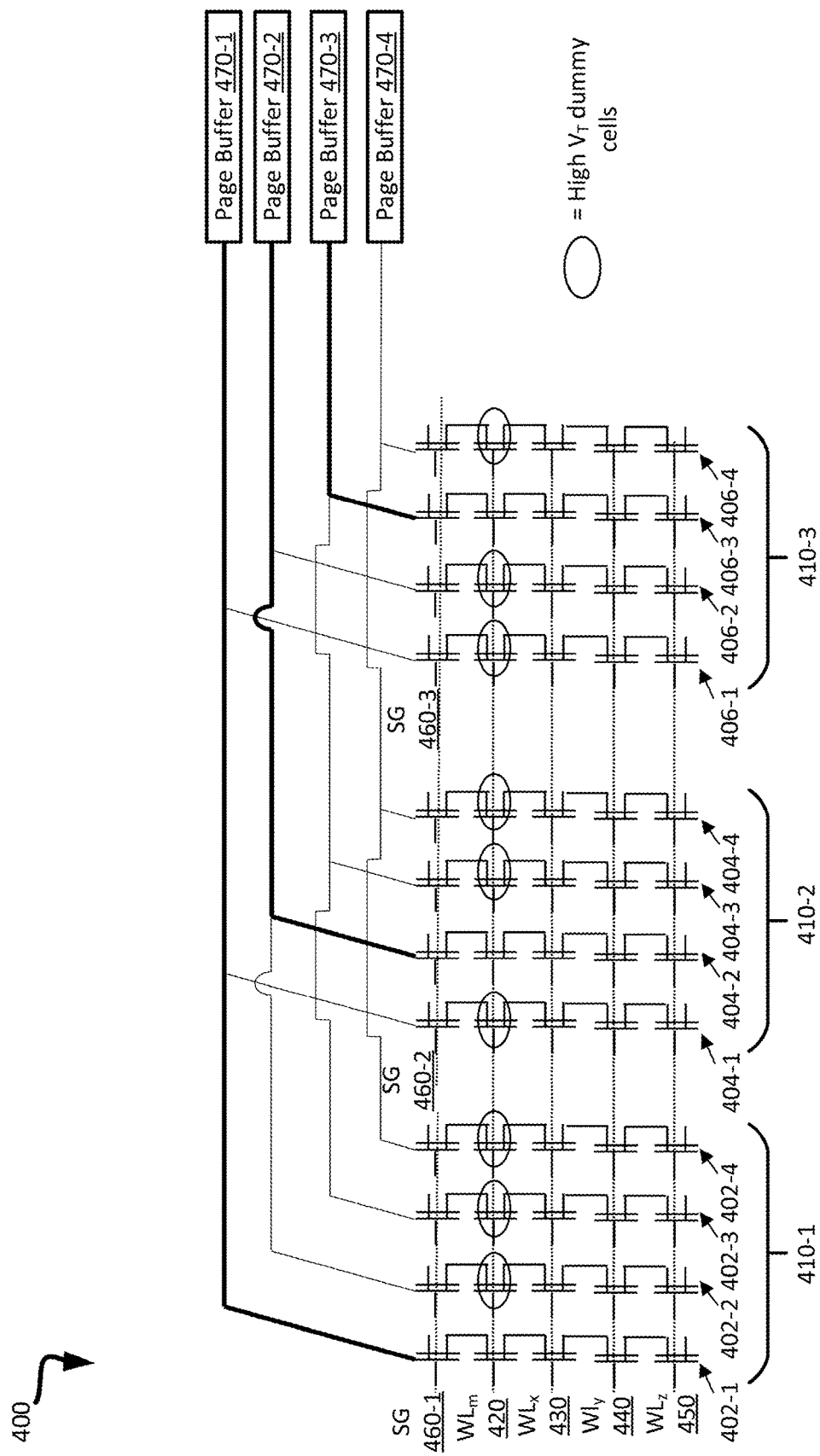

FIGS. 4A-4B are diagrams of an example system 400 illustrating an implementation of parallelized defect detection, in accordance with some embodiments, As shown, the system 400 includes a block of memory cells ("block") 405, the block 405 is divided into a number of sub-blocks 410-1 through 410-4. Although 4 sub-blocks are shown, the block 405 can be divided into any suitable number of sub-blocks in accordance with embodiments described herein. Each of the sub-blocks 410-1 through 410-4 can have any suitable size. For example, each of the sub-blocks 410-1 through 410-4 can have a 16 KB size.

As further shown, the block 405 includes a mask wordline ($WL_m$) 420 that extends across the sub-blocks 410-1 through 410-4. As shown in FIG. 4B, the block 405 further includes non-mask wordlines (e.g., data wordlines) 430-450. Although FIG. 4B only shows wordlines 430-450 extending across sub-blocks 410-1 through 410-3, wordlines 430-450 further extend across sub-block 410-4.

Each of the sub-blocks 410-1 through 410-4 includes a respective set of dummy cells connected to the dummy wordline 420. For example, as shown in FIG. 4A, sub-block 410-1 includes dummy cells 422-1 through 428-1, sub-block 410-2 includes dummy cells 422-2 through 428-2, sub-block 410-3 includes dummy cells 422-3 through 428-3, and sub-block 410-4 includes dummy cells 422-4 through 428-4. Each of the sub-blocks 410-1 through 410-4 further includes a respective set of data cells connected the non-mask wordlines 430-450. Each of the sub-blocks 410-1 through 410-4 further includes a respective set of select gates (e.g., select gate transistors) connected to a respective select gate line (SG). For example, as shown in FIG. 4B, sub-block 410-1 includes a SG 460-1 having select gates 462-1 through 468-1 connected thereto, and sub-block 410-2 includes SG 460-2 having select gates 462-2 through 468-2 connected thereto. Sub-blocks 410-3 and 410-4 can include similar SG's. In some embodiments, SG 415-1 and SG 415-2 are drain-side select gates.

Each of the sub-blocks 410-1 through 410-4 can include a set of strings of cells ("strings"), where each string is connected to a respective bitline. As shown in FIG. 4B, sub-block 410-1 includes strings 402-1 through 402-4, sub-block 410-2 includes strings 404-1 through 404-4, and sub-block 410-3 includes strings 406-1 through 406-4 (although not shown, sub-block 410-4 can include similar strings). Each of the strings can include the cells from the wordlines 420-450 that intersect the string, and the select gate that intersects the string. Accordingly, each of the strings can have a single cell from dummy wordline 420, a single cell from data wordline 430, a single cell from data wordline 440, and a single cell from data wordline 450.

Each of the strings is located with a respective sub-block position ("position"). For example, strings 402-1, 404-1 and 406-1 are located in a first position, strings 402-2, 404-2 and 406-2 are located in a second position, strings 402-3, 404-3 and 406-3 are located in a third position, and strings 402-4, 404-4 and 406-4 are located in a fourth position. Sub-block 410-4 can include a similar arrangement of strings. Each position reflects a respective data size range within a sub-block. For example, if each of the sub-blocks 410-1 through 410-4 has a size of 16 KB, then the string in the first position can correspond to a 0-4 KB range, the string in the second position can correspond to a 4-8 KB range, the string in the third position can correspond to an 8-12 KB range and the string in the fourth position can correspond to a 12-16 KB range. Accordingly, in this illustrative example, each of the strings can represent a quarter of the total data of its corresponding sub-block.

As further shown in FIG. 4B, the system 400 can further include a number of page buffers including page buffers 470-1 through 470-4. Each string within a particular sub-block can be connected to a different page buffer, and strings having the same position across sub-blocks are connected to the same page buffer. For example, strings 402-1 through 406-1 are connected to page buffer 470-1, strings 402-2 through 406-2 are connected to page buffer 470-2, strings 402-3 through 406-3 are connected to page buffer 470-3, and strings 402-4 through 406-4 are connected to page buffer 470-4. Similarly, each string of sub-block 410-4 can be connected to the same buffer as those strings of sub-blocks 410-1 through 410-3 having the same position as the string of sub-block 410-4.

To implement parallel defect detection across the sub-blocks 410-1 through 410-4, a local media controller (e.g., local media controller 135 of FIGS. 1A-1B) can cause dummy cells connected to the mask wordline 420 to be programmed in a dummy cell pattern of low $V_T$ dummy cells and high $V_T$ dummy cells. For example, as shown in FIG. 4A, dummy cells 422-1, 424-2, 426-3 and 428-4 are programmed as low $V_T$ dummy cells having a low $V_T$ (e.g., erased state cells), while the remaining dummy cells are programmed as high $V_T$ dummy cells having a high $V_T$ (e.g., programmed state cells). The programming is performed so that each of the sub-blocks 410-1 through 410-4 includes a single low $V_T$ dummy cell connected to a string having a different position than the single low $V_T$ dummy cell of the other sub-blocks. In this illustrative example, as shown in FIG. 4B, the single low $V_T$ dummy cell of sub-block 410-1 is connected to the string 402-1 located in the first position, the single low $V_T$ dummy cell of sub-block 410-2 is connected to the string 404-2 located in the second position, and the single low $V_T$ dummy cell of sub-block 410-3 is connected to the string 406-3 located in the third position. Although not shown, the single low $V_T$ dummy cell of sub-block 410-4 is connected to the string of the sub-block 410-4 located in the fourth position. The dummy cell pattern shown in FIGS. 4A-4B is purely exemplary, and any suitable pattern in accordance with embodiments described herein.

The local media controller can then select (e.g. enable) each of the sub-blocks 410-1 through 410-4. In some embodiments, each of the sub-blocks 410-1 through 410-4 can be simultaneously selected. Each of the sub-blocks 410-1 through 410-4 can be selected by applying a respective select gate voltage (VSG) its respective SG. For example, a first VSG can be applied to SG 460-1 to select the sub-block 410-1, a second VSG can be applied to SG 460-2 to select the sub-block 410-2, etc.

The local media controller can then cause a mask voltage to be applied to the dummy cells connected to the mask wordline 420. The mask voltage has a magnitude that activates (e.g., turns on) the low $V_T$ dummy cells while deactivating (e.g., turns off or keeps off) the high $V_T$ cells. For example, the mask voltage can have a magnitude that falls within a valley or read window between the low $V_T$ cell distribution and the high $V_T$ cell distribution. When the mask voltage is applied to the mask wordline 420, the only cells that are deactivated (e.g., turned off) among the sub-blocks 410-1 through 410-4 are the high $V_T$ dummy cells. Therefore, although each of the sub-blocks 410-1 through 410-4 are selected, the application of the mask voltage acts to "select," from each of the sub-blocks 410-1 through 410-4, the single string of the sub-block that includes a low $V_T$ dummy cell (e.g., string 402-1 of sub-block 410-1, string 404-2 of sub-block 410-2 and string 406-3 of sub-block 410-3).

One of the data wordlines 430-450 can be a selected wordline, while the remaining ones of the data wordlines 430-450 are unselected wordlines. Illustratively, data wordline 450 can be a selected wordline. The local media controller can cause an unselected wordline voltage (e.g., pass-through voltage ($V_{pass}$)) to be applied to the cells connected to the unselected wordlines 430 and 440. The application of the unselected wordline voltage activate the cells connected to the unselected wordlines 430 and 440, which allows the cells connected to the unselected wordlines 430 and 440 to pass data along their respective strings in the direction of the select gates.

The local media controller can further cause a selected wordline voltage to be applied to the cells connected to the selected wordline 450. The selected wordline voltage causes data from the cells connected to the selected wordline to be passed along their respective strings in the direction of the select gates for reading by respective page buffers. Each high $V_T$ dummy cell prevents the data from the selected wordline cell in its string from being sent to the page buffer connected to the string. Thus, each of the page buffers 470-1 through 470-4 receives data from a single string of one of the sub-blocks 410-1 through 410-4. For example, as indicated by the bolded lines in FIG. 4B, page buffer 470-1 receives data from string 402-1, page buffer 470-2 receives data from string 404-2, and page buffer 470-3 receives data from string 406-3 (and page buffer 470-4 receives data from the string of sub-block 410-4 that is located in the fourth position).

Data from only one string from each of the sub-blocks 410-1 through 410-4 is used to perform defect detection for its corresponding sub-block. That is, in this example, a quarter of the total amount of data of each of the sub-blocks 410-1 through 410-4 is used to perform defect detection for each sub-block (e.g., 4 KB of the 16 KB total). This amount of data is enough due to the sufficient randomization achieved by L2P mapping (e.g., performing defect detection on 4 logical KBs of a sub-block covers the entire 16 physical KBs of the sub-block) Therefore, the generation of a dummy cell pattern of dummy cells of a mask wordline, and application of the mask voltage to the dummy cells of the mask wordline enables parallel defect defection to be performed across the sub-blocks 410-1 through 410-3.

FIG. 5 is a timing diagram ("diagram") 500 illustrating defect detection, in accordance with some embodiments. The diagram 500 includes an x-axis 502 corresponding to time (t). A first sub-block (SB0) 510-1 is programmed at time t0, a second sub-block (SB1) 510-2 is programmed at time t1, a third sub-block (SB2) 510-3 is programmed at time t2 and a fourth sub-block (SB3) 510-4 is programmed at time t3. The sub-blocks 510-1 through 510-4 can be programmed back-to-back with verify.

As the program pattern of each of the sub-blocks 510-1 through 510-4 is made available, a set of input data 520 can be gathered (e.g., scatter gathered). For example, the set of data includes input data 522-1 gathered from SB0 510-1, input data 522-2 gathered from SB1 510-2, input data 522-3 gathered from SB2 510-3 and input data 522-4 gathered from SB3 510-4. The set of input data 520 can be 16 KB total, such that each of the input data 522-1 through 522-4 has a 4 KB size. Verified data can be compared against the input data 522-1 through 522-4 to perform defect detection. If there is a defect, the defect can be reported. For example, in RAIM solutions, firmware can execute data recovery using RAIM, and a failing page can be reprogrammed to a new location. As another example, in RAIM-less solutions, the defect can be reported to the host, and the host can rewrite the data to a new location. In response to programming SB3 510-4, a set of data 520 is gathered from the sub-blocks 510-1 through 510-4 to match the mask pattern described with reference to FIGS. 1A and 4A-4B. Accordingly, instead of performing a defect detection operation (e.g., verify) after programming each of the sub-blocks 510-1 through 510-4 (e.g., four programming operations and four defect detection operations for a total of eight operations), the defect detection described herein can execute a single defect detection operation across all of the programmed sub-blocks (e.g., four programming operations and one defect detection operation).

Figure 6:
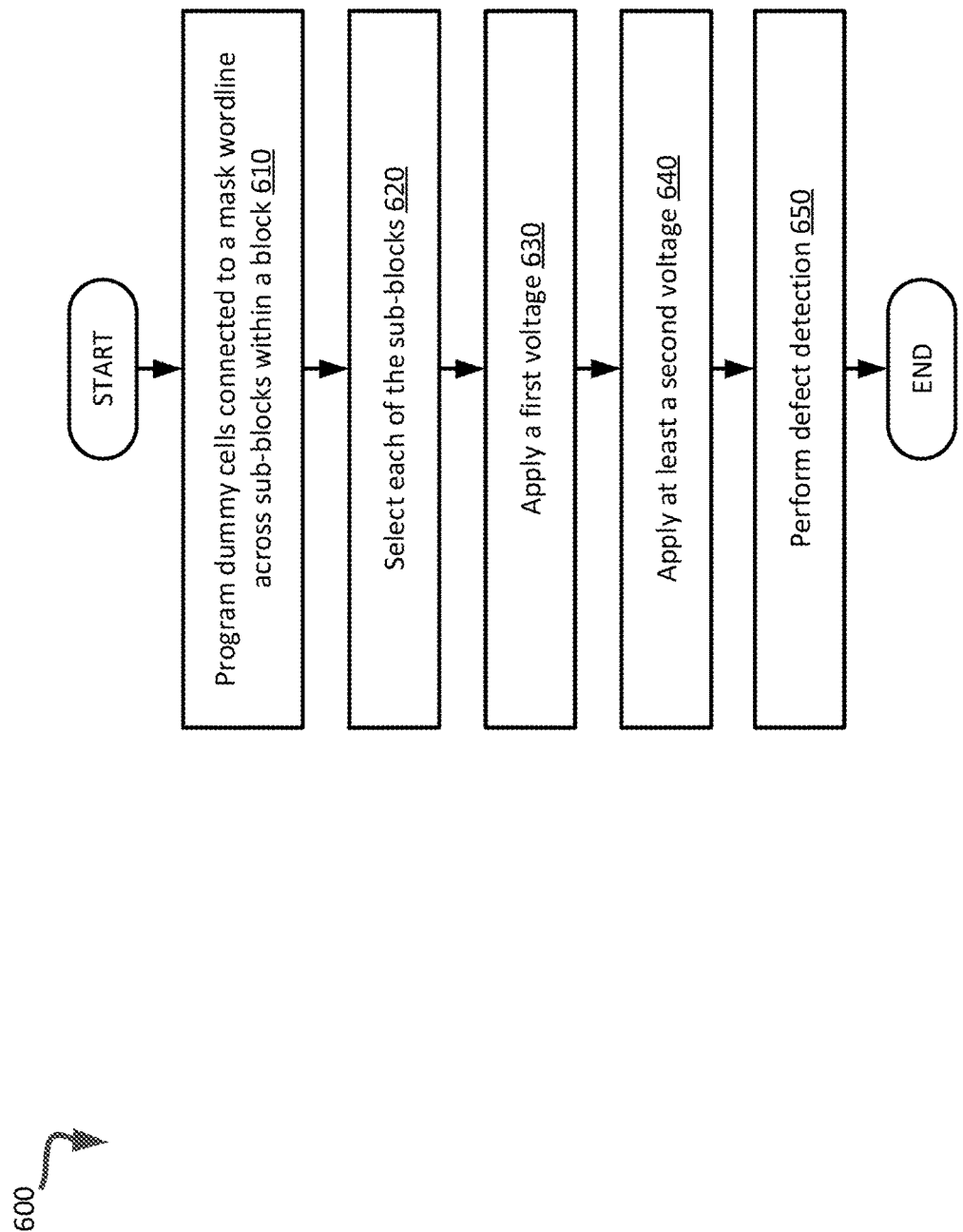
FIG. 6 is a flow diagram of a method to implement parallelized defect detection across multiple sub-blocks in a memory device, in accordance with some embodiments of the present disclosure.

FIG. 6 is a flow diagram of an example method 600 to implement parallel defect detection across multiple sub-blocks, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the DD component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, dummy cells connected to a mask wordline are programmed across sub-blocks within a block. For example, the processing logic (e.g., local media controller 135) can cause the dummy cells to be programmed. In some embodiments, the block is included in a memory device having SLC cells. However, the memory device can include cells having any suitable cell type.

Each dummy cell within a sub-block can be included within a respective string of cells of the sub-block, where each string is connected to a respective bitline. Each string is located at a respective position within its sub-block. For example, if there are 4 sub-blocks, each of the sub-blocks can include a string located in a first position, a string located in a second position different from the first position, a string located in a third position different from the first position and the second position, and a string located in a fourth position different from the first position, the second position and the third position. Each position within a sub-block reflects a respective data size range within the sub-block. For example, if each of the sub-blocks has a size of 16 KB and includes 4 strings, then the string in the first position can correspond to a 0-4 KB range, a string in the second position can correspond to a 4-8 KB range, a string in the third position can correspond to an 8-12 KB range and the string in the fourth position can correspond to a 12-16 KB range.

Each of the strings can be connected to a page buffer. More specifically, each page buffer can be connected to the strings of each of the sub-blocks having a same position. For example, if there are 4 sub-blocks, a first page buffer can be connected to the strings located at the first position within each sub-block, a second page buffer can be connected to the strings located at the second position within each sub-block, a third page buffer can be connected to the strings located at the third position within each sub-block, and a fourth page buffer can be connected to the strings located at the fourth position within each sub-block.

The dummy cells connected to the mask wordline can be programmed to achieve a dummy cell pattern of low $V_T$ dummy cells having a low $V_T$ (e.g., erased state) and high $V_T$ dummy cells having a high $V_T$ (e.g., programmed state). More specifically, the low $V_T$ has a magnitude smaller than the high $V_T$. For example, the processing logic can cause one dummy cell within each sub-block can be programmed as a low $V_T$ dummy cell, and the remaining dummy cells to be programmed as high $V_T$ dummy cells. The processing logic can cause the dummy cells connected to the mask wordline to be programmed such that each of the sub-blocks includes a single string in having a low $V_T$ dummy cell, where each single string has a different position than the other single strings. Illustratively, if there are four total sub-blocks, a low $V_T$ dummy cell of a first sub-block can be located in the first position, a low $V_T$ dummy cell of a second sub-block can be located in the second position, a low $V_T$ dummy cell of a third sub-block can be located in the third position, and a low $V_T$ dummy cell of a fourth sub-block can be located in the fourth position.

At operation 620, each of the sub-blocks are selected. For example, the processing logic can select (e.g., enable) each of the sub-blocks by applying a respective voltage to a respective select gate connected to the sub-block. In some embodiments, the sub-blocks are simultaneously selected. The sub-blocks can be selected to perform defect detection in parallel across each of the sub-blocks, as opposed to performing individual defect detection operations serially on each the sub-blocks individually.

At operation 630, a first voltage is applied. For example, the processing logic can cause the first voltage, also referred to as a mask voltage, to be applied to the dummy cells connected to the mask wordline. The first voltage has a magnitude that can selectively activate (e.g., turns on) the dummy cells connected to the mask wordline in accordance with the dummy cell pattern. More specifically, the low $V_T$ cells connected to the mask wordline are activated and the high $V_T$ cells connected to the mask wordline are deactivated (e.g., turned off). For example, the first voltage can have a magnitude within a valley or read window located between the low $V_T$ dummy cell distribution and the high $V_T$ dummy cell distribution. Accordingly, applying the first voltage creates, for each sub-block, an open string corresponding to the single string having the low $V_T$ dummy cell and closed strings corresponding to the remaining strings having the high $V_T$ dummy cells.

At operation 640, at least a second voltage is applied. For example, the processing logic can cause the second voltage, also referred to as a selected wordline voltage, to be applied to data cells connected to a selected wordline across the plurality of sub-blocks. Applying the second voltage to the data cells connected to the selected wordline can cause data (e.g., a bit) stored each data cell to be read out to respective page buffers.

Since the high $V_T$ dummy cells within each sub-block prevent data from being read out through their respective closed strings to their respective page buffers, the data that is read out from each sub-block is data from the single open string. Thus, data for each sub-block will be read out to a respective page buffer connected to the open string of the sub-block. For example, if there are 4 sub-blocks, data can be read out to a first page buffer from the open string in the first sub-block, data can be read out to a second page buffer from the open string in the second sub-block, data can be read out to a third page buffer from the open string in the third sub-block, and data can be read out to a fourth page buffer from the open string in the fourth sub-block.

The processing logic can, prior to applying the second voltage, further cause a third voltage, also referred to as an unselected wordline voltage, to be applied to data cells connected to at least one unselected wordline. For example, the third voltage can be a pass-through voltage. The third voltage activates (e.g., turns on) the data cells of the unselected wordlines to allow the data to be read out to the respective page buffers connected to the open strings.

At operation 650, defect detection is performed. For example, the processing logic can cause defect detection to be performed in parallel across each of the sub-blocks using the data that was read out from each open string. In some embodiments, the processing logic can use the data to determine, for each sub-block, whether the data indicates a defect. For example, the processing logic can count a number of bits that flipped logic states (e.g., flipped from a '1' to a '0' or a '0' to a '1'). As another example, the processing logic can determine an error rate for each of the sub-blocks.

The programming of a dummy cell pattern and subsequent application of a mask voltage to the dummy cell pattern can enable parallel defect detection to be performed across the sub-blocks in a single defect detection operation, as opposed to performing serial defect detection on each of the sub-blocks using individual defect detection operations. By performing defect detection in parallel across sub-blocks as described herein, the processing logic can reduce defect detection latency and enable the performance of defect detection in verify-less memory device implementations. Further details regarding operations 610-650 are described above with reference to FIGS. 1A and 4-5.

Figure 7:
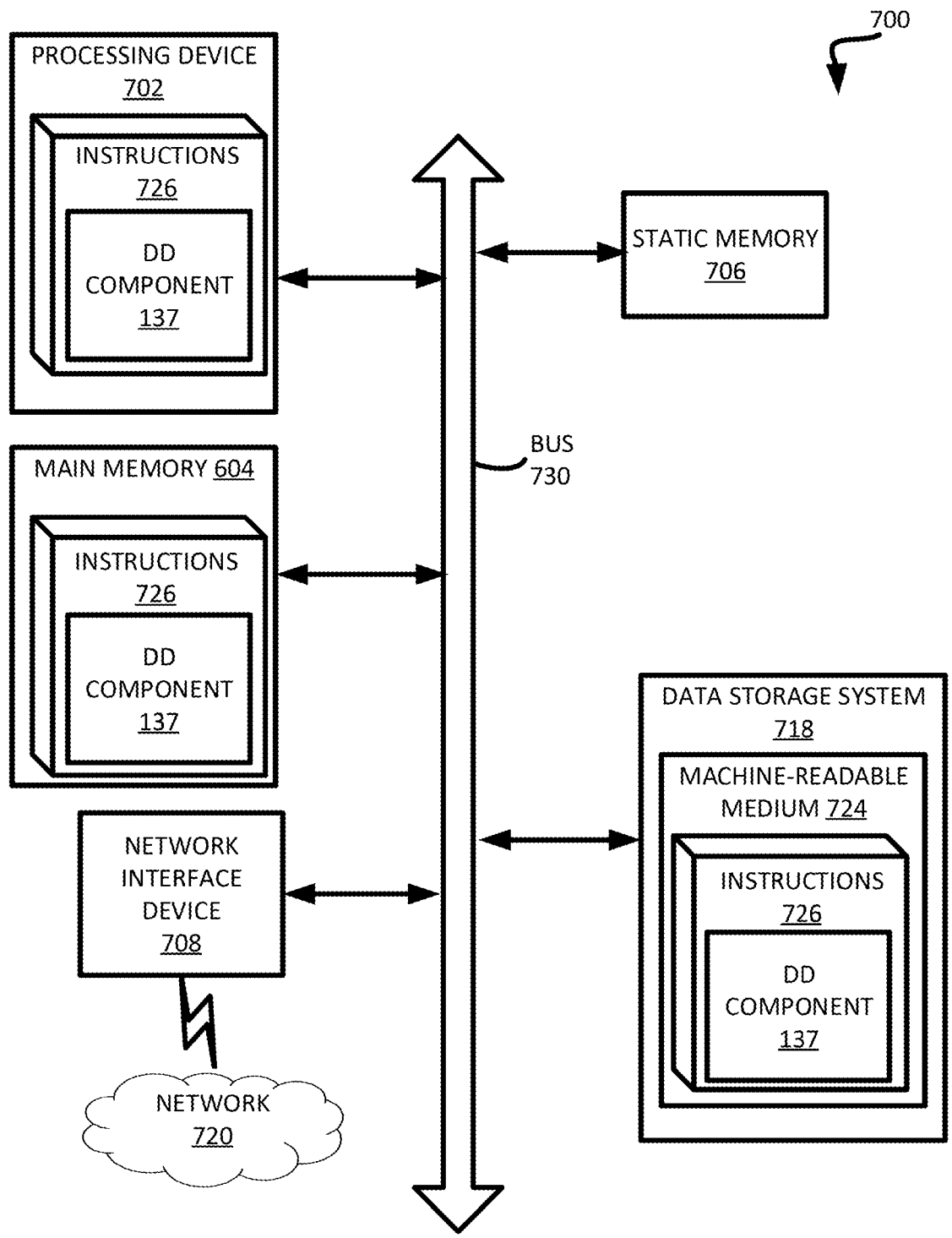
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the DD component 137 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a DD component (e.g., the DD component 137 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a block having a plurality of wordlines, a plurality of bitlines, and a plurality of strings, each string of the plurality of strings being connected to a respective bitline of the plurality of bitlines, wherein the block is divided into a plurality of sub-blocks comprising a first sub-block and a second sub-block, wherein each sub-block of the plurality of sub-blocks comprises a respective set of strings of the plurality of strings, and wherein each string of the set of strings is located at a sub-block position within its respective sub-block; and
control logic, operatively coupled with the memory array, to perform operations comprising:
selecting each sub-block of the plurality of sub-blocks;
causing a first voltage to be applied to a dummy wordline of the plurality of wordlines, wherein the first voltage activates a first set of dummy cells associated with the dummy wordline and having a first state and deactivates a second set of cells associated with the dummy wordline and having a second state different from the first state, wherein each sub-block of the plurality of sub-blocks comprises a single string of the set of strings corresponding to an open string connected to a respective dummy cell of the first set of dummy cells and remaining strings of the set of strings each corresponding to a closed string connected to a respective dummy cell of the second set of dummy cells, and wherein the open string of the first sub-block is located at a different sub-block position than the open string of the second sub-block; and
causing a second voltage to be applied to a selected wordline of the plurality of wordlines, wherein the second voltage causes data to be read out from each open string to a respective page buffer of a plurality of page buffers.

2. The memory device of claim 1, wherein the operations further comprise causing a plurality of dummy cells connected to the dummy wordline to be programmed in accordance with a dummy cell pattern to define the first set of dummy cells and the second set of dummy cells.

3. The memory device of claim 1, wherein the first state is an erased state and the second state is a programmed state.

4. The memory device of claim 1, wherein the first state corresponds to a first threshold voltage distribution, wherein the second state corresponds to a second threshold voltage distribution, wherein each dummy cell of the first set of dummy cells has a lower threshold voltage than each dummy cell of the second set of dummy cells, and wherein the first voltage has a magnitude located in a valley between the first threshold voltage distribution and the second threshold voltage distribution.

5. The memory device of claim 1, wherein each string of the plurality of strings that has a same sub-block position is connected to a same page buffer of the plurality of page buffers.

6. The memory device of claim 1, wherein the operations further comprise, prior to causing the second voltage to be applied to the selected wordline, causing a third voltage to be applied to an unselected wordline of the plurality of wordlines, and wherein the third voltage activates a plurality of second data cells connected to the unselected wordline to enable the data to be read out from each open string to the respective page buffer.

7. The memory device of claim 1, wherein the operations further comprise causing a defect detection operation to be performed in parallel across the plurality of sub-blocks based on the data read out from the open string of each sub-block of the plurality of sub-blocks to the respective page buffer.

8. A method, comprising:
selecting, by a processing device, a plurality of sub-blocks of a block of a memory device, wherein the block comprises a plurality of wordlines, a plurality of bitlines, and a plurality of strings, each string of the plurality of strings being connected to a respective bitline of the plurality of bitlines, wherein the block is divided into a plurality of sub-blocks comprising a first sub-block and a second sub-block, wherein each sub-block of the plurality of sub-blocks comprises a respective set of strings of the plurality of strings, and wherein each string of the set of strings is located at a sub-block position within its respective sub-block;
causing, by the processing device, a first voltage to be applied to a dummy wordline of the plurality of wordlines, wherein the first voltage activates a first set of dummy cells associated with the dummy wordline and having a first state and deactivates a second set of cells associated with the dummy wordline and having a second state different from the first state, wherein each sub-block of the plurality of sub-blocks comprises a single string of the set of strings corresponding to an open string connected to a respective dummy cell of the first set of dummy cells and remaining strings of the set of strings each corresponding to a closed string connected to a respective dummy cell of the second set of dummy cells, and wherein the open string of the first sub-block is located at a different sub-block position than the open string of the second sub-block; and causing, by the processing device, a second voltage to be applied to a selected wordline of the plurality of wordlines, wherein the second voltage causes data to be read out from each open string to a respective page buffer of a plurality of page buffers.

9. The method of claim 8, further comprising causing, by the processing device, a plurality of dummy cells connected to the dummy wordline to be programmed in accordance with a dummy cell pattern to define the first set of dummy cells and the second set of dummy cells.

10. The method of claim 8, wherein the first state is an erased state and the second state is a programmed state.

11. The method of claim 8, wherein the first state corresponds to a first threshold voltage distribution, wherein the second state corresponds to a second threshold voltage distribution, wherein each dummy cell of the first set of dummy cells has a lower threshold voltage than each dummy cell of the second set of dummy cells, and wherein the first voltage has a magnitude located in a valley between the first threshold voltage distribution and the second threshold voltage distribution.

12. The method of claim 8, wherein each string of the plurality of strings that has a same sub-block position is connected to a same page buffer of the plurality of page buffers.

13. The method of claim 8, further comprising, prior to causing the second voltage to be applied to the selected wordline, causing, by the processing device, a third voltage to be applied to an unselected wordline of the plurality of wordlines, and wherein the third voltage activates a plurality of second data cells connected to the unselected wordline to enable the data to be read out from each open string to the respective page buffer.

14. The method of claim 13, further comprising causing, by the processing device, a defect detection operation to be performed in parallel across the plurality of sub-blocks based on the data read out from the open string of each sub-block of the plurality of sub-blocks to the respective page buffer.

15. A memory device comprising:
a memory array comprising a block having a plurality of wordlines, a plurality of bitlines, and a plurality of strings, each string of the plurality of strings being connected to a respective bitline of the plurality of bitlines, wherein the block is divided into a plurality of sub-blocks comprising a first sub-block and a second sub-block, wherein each sub-block of the plurality of sub-blocks comprises a respective set of strings of the plurality of strings, and wherein each string of the set of strings is located at a sub-block position within its respective sub-block; and
control logic, operatively coupled with the memory array, to perform operations comprising:

causing a plurality of dummy cells to be programmed to have a dummy cell pattern to define a first set of dummy cells having a first state and a second set of dummy cells having a second state different from the first state, wherein the plurality of dummy cells is associated with a dummy wordline of the plurality of wordlines; and causing a defect detection operation to be performed in parallel across the plurality of sub-blocks in accordance with the dummy cell pattern.

16. The memory device of claim 15, wherein the first state is an erased state and the second state is a programmed state.

17. The memory device of claim 15, wherein causing defect detection to be performed in parallel across the plurality of sub-blocks further comprises:

selecting the plurality of sub-blocks;

causing a first voltage to be applied to the dummy wordline, wherein the first voltage activates the first set of dummy cells and deactivates the second set of cells, wherein each sub-block of the plurality of sub-blocks comprises a single string of the set of strings corresponding to an open string connected to a respective dummy cell of the first set of dummy cells and remaining strings of the set of strings each corresponding to a closed string connected to a respective dummy cell of the second set of dummy cells, and wherein the open string of a first sub-block of the plurality of sub-blocks is located at a different sub-block position than the open string of a second sub-block of the plurality of sub-blocks; and causing a second voltage to be applied to a selected wordline of the plurality of wordlines, wherein the second voltage causes data to be read out from each open string to a respective page buffer.

18. The memory device of claim 17, wherein the defection detection operation is performed based on the data read out from the open string of each sub-block of the plurality of sub-blocks to the respective page buffer.

19. The memory device of claim 17, wherein the first state corresponds to a first threshold voltage distribution, wherein the second state corresponds to a second threshold voltage distribution, wherein each dummy cell of the first set of dummy cells has a lower threshold voltage than each dummy cell of the second set of dummy cells, and wherein the first voltage has a magnitude located in a valley between the first threshold voltage distribution and the second threshold voltage distribution.

20. The memory device of claim 17, wherein the operations further comprise, prior to causing the second voltage to be applied to the selected wordline, causing a third voltage to be applied to an unselected wordline of the plurality of wordlines, and wherein the third voltage activates a plurality of second data cells connected to the unselected wordline to enable the data to be read out from each open string to the respective page buffer.

* * * * *